(12) United States Patent
Tabata et al.

(10) Patent No.: US 10,217,643 B2
(45) Date of Patent: Feb. 26, 2019

(54) METHOD OF PROCESSING TARGET OBJECT

(71) Applicant: Tokyo Electron Limited, Tokyo (JP)

(72) Inventors: Masahiro Tabata, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/686,285

(22) Filed: Aug. 25, 2017

(65) Prior Publication Data

US 2018/0061655 A1 Mar. 1, 2018

(30) Foreign Application Priority Data

Aug. 29, 2016 (JP) ................................ 2016-167071

(51) Int. Cl.
*H01L 21/3065* (2006.01)
*H01L 21/308* (2006.01)
*H01L 21/027* (2006.01)
*H01L 21/02* (2006.01)
*H01J 37/32* (2006.01)

(52) U.S. Cl.
CPC .... *H01L 21/30655* (2013.01); *H01L 21/0273* (2013.01); *H01L 21/02211* (2013.01); *H01L 21/3083* (2013.01); *H01J 37/32165* (2013.01); *H01J 2237/3342* (2013.01); *H01L 21/02164* (2013.01); *H01L 21/02274* (2013.01)

(58) Field of Classification Search
CPC ...................... H01L 21/30655; H01L 21/3083
See application file for complete search history.

(56) References Cited

U.S. PATENT DOCUMENTS

2016/0343580 A1* 11/2016 Hudson ............. H01J 37/32513
2017/0040214 A1* 2/2017 Lai ..................... H01L 21/32136
2017/0178920 A1* 6/2017 Dole ................. H01J 37/32899

FOREIGN PATENT DOCUMENTS

JP 2004-080033 A 3/2004

* cited by examiner

*Primary Examiner* — Selim Ahmed
*Assistant Examiner* — Evan Clinton
(74) *Attorney, Agent, or Firm* — Pearne & Gordon LLP

(57) ABSTRACT

A method of processing a target object is provided. The target object includes a first protrusion portion, a second protrusion portion, an etching target layer and a groove portion. The groove portion is provided on a main surface of the target object, provided on the etching target layer and defined by the first and the second protrusion portions. An inner surface of the groove portion is included in the main surface. In the method, a first sequence is repeatedly performed N times (N is an integer equal to or larger than 2). The first sequence includes (a) forming a protection film conformally on the main surface in a processing vessel of a plasma processing apparatus in which the target object is accommodated; and (b) etching a bottom portion of the groove portion with plasma of a gas generated within the processing vessel after the process a is performed.

16 Claims, 7 Drawing Sheets

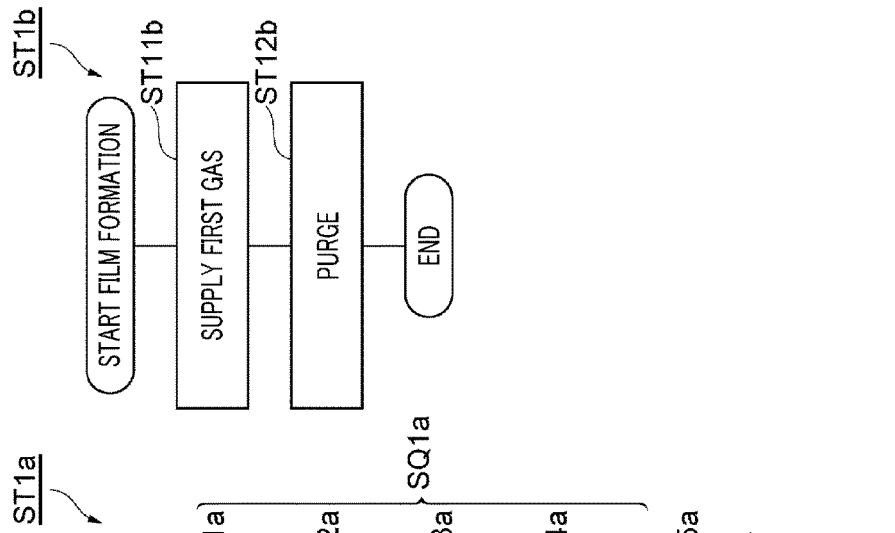
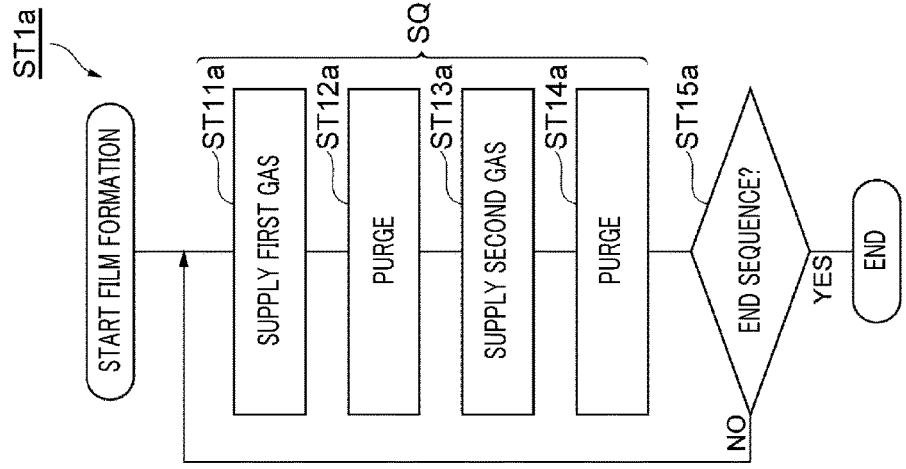
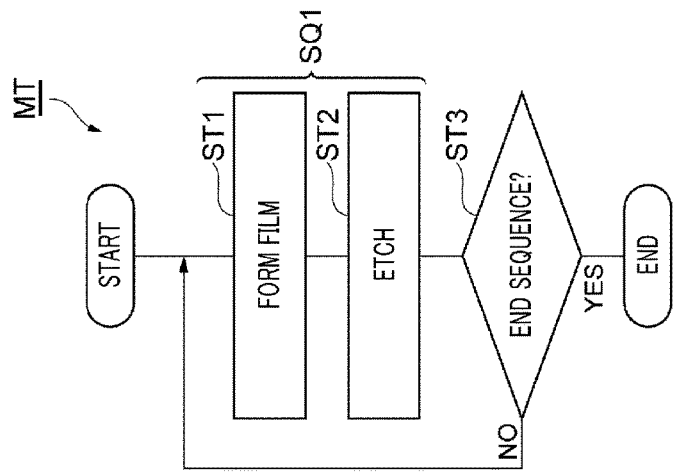

METHOD OF PROCESSING TARGET OBJECT

CROSS-REFERENCE TO RELATED APPLICATION

This application claims the benefit of Japanese Patent Application No. 2016-167071 filed on Aug. 29, 2016, the entire disclosures of which are incorporated herein by reference.

TECHNICAL FIELD

The embodiments described herein pertain generally to a method of processing a target object; and, more particularly, to a method of performing a surface processing on a semiconductor substrate with plasma.

BACKGROUND

A plasma processing may be performed on a target object such as a wafer by using a plasma processing apparatus. A plasma etching is one kind of such a plasma processing. The plasma etching is performed to transcribe a pattern of a mask formed on an etching target layer to the etching target layer. Generally, the mask is implemented by a resist mask. The resist mask is formed by a photolithography technique. Thus, a limit size of the pattern formed on the etching target layer depends on a resolution of the resist mask formed by the photolithography technique.

As a demand for high integration of electronic devices is getting higher, it is required to form the pattern smaller than the resolution limit of the resist mask. However, there is a limit in the resolution of the resist mask. Thus, as described in Patent Document 1, there is proposed a technique of adjusting a size of the resist mask and reducing a width of an opening provided in the resist mask by forming a silicon oxide film on the resist mask.

Patent Document 1: Japanese Patent Laid-open Publication No. 2004-080033

Meanwhile, as the electronic devices are miniaturized to meet the recent trend of the high integration, it is required to control a critical dimension (CD) with high accuracy when forming the pattern on the target object. Further, it may also be required to form various shapes of patterns.

As stated above, with regard to the pattern formation on the target object, it is required to develop a technique capable of coping with formation of various shapes of patterns as well as miniaturization of the patterns to meet the recent trend of high integration.

SUMMARY

In an exemplary embodiment, there is provided a method of processing a target object. The target object includes a first protrusion portion, a second protrusion portion, an etching target layer and a groove portion. The etching target layer has a region belonging to the first protrusion portion and a region belonging to the second protrusion portion. The groove portion is provided on a main surface of the target object, provided on the etching target layer and defined by the first protrusion portion and the second protrusion portion. An inner surface of the groove portion is included in the main surface of the target object. In the method, a first sequence is repeatedly performed N times (N is an integer equal to or larger than 2). The first sequence includes forming a protection film conformally on the main surface of the target object in a processing vessel of a plasma processing apparatus in which the target object is accommodated (referred to as "process a"); and etching a bottom portion of the groove portion of the target object with plasma of a gas generated within the processing vessel after the process a is performed (referred to as "process b").

In the method, the process a of conformally forming the protection film on the main surface of the target object (including the inner surface of the groove portion) and the process b of etching the bottom portion of the groove portion provided on the main surface after the process a may be alternately repeated. Thus, by appropriately adjusting the film thickness of the protection film or the like for each of the multiple cycles of the process a and by appropriately adjusting the etching amount or the like for each of the multiple cycles of the process b, the groove portion can be processed with relatively high accuracy according to the various required shapes of the groove portion.

In the process a, the protection film may be conformally formed on the main surface of the target object by repeatedly performing a second sequence including supplying a first gas into the processing vessel (referred to as "process c"); purging a space within the processing vessel after the process c is performed (referred to as "process d"); generating plasma of a second gas within the processing vessel after the process d is performed (referred to as "process e"); and purging the space within the processing vessel after the process e is performed. In the process c, plasma of the first gas may not be generated. As stated above, in the process a, since the protection film is conformally formed on the main surface of the target object (including the inner surface of the groove portion) by the same method as the ALD (Atomic Layer Deposition) method, the strength of protection of the main surface of the target object can be improved, and the protection film for protecting the main surface of the target object can be formed in the uniform thickness.

In the process a, the protection film may be conformally formed on the main surface of the target object by supplying a first gas into the processing vessel (referred to as "process f") and purging a space within the processing vessel after the process f is performed. In the process b following the process a, the bottom portion of the groove portion of the target object may be etched with plasma of an oxygen-containing gas generated within the processing vessel. In the process f, plasma of the first gas may be not generated. As stated above, since the process a only consists of the process f of forming the reaction precursor on the main surface of the target object (including the inner surface of the groove portion) with the first gas and the process of purging the space within the processing vessel after the process f is performed, the protection film formed through the process a can be formed of the reaction precursor formed through the process f, and, accordingly, can be a relatively thin film. In addition, since the plasma of the oxygen-containing gas is used in the process b following the process a, oxygen can be added to the reaction precursor formed in the process f, and the protection film having the same composition as the protection film formed by the same method as the ALD method can be formed to have a relatively thin thickness. Furthermore, since the addition of the oxygen gas can be performed during the etching of the process b, high efficiency of the processing can be achieved.

In the performing of the first sequence repeatedly N times, the first sequence including a first processing may be performed M times (M is an integer equal to or lager than 1 and equal to or smaller than N−1), and the first sequence including a second processing may be performed N−M times. The first processing may be included in the process a. In the first processing, the protection film may be conformally formed on the main surface of the target object by repeatedly performing a second sequence including supplying a first gas into the processing vessel (referred to as "process g"); purging a space within the processing vessel after the process g is performed (referred to as "process h"); generating plasma of a second gas within the processing vessel after the process h is performed (referred to as "process i"); and purging the space within the processing vessel after the process i is performed. The second processing may be included in the process a. In the second processing, the protection film may be conformally formed on the main surface of the target object by supplying the first gas into the processing vessel (referred to as "process j") and purging the space within the processing vessel after the process j is performed. In the process b following the second processing, the bottom portion of the groove portion of the target object may be etched by plasma of an oxygen-containing gas generated within the processing vessel. Plasma of the first gas may not be generated in the process g performed in the first processing and the process j performed in the second processing. As stated above, in the first processing, since the protection film is conformally formed on the main surface of the target object (including the inner surface of the groove portion) by the same method as the ALD method, the strength of the protection of the main surface of the target object can be improved, and the protection film for protecting the main surface of the target object can be formed in the uniform thickness. Further, since the second processing only consists of the process j of forming the reaction precursor on the main surface of the target object (including the inner surface of the groove portion) with the first gas and the process of purging the space within the processing vessel after the process j is performed, the protection film formed through the second processing can be formed of the reaction precursor formed through the process j, and, accordingly, can become a relatively thin film. In addition, since the plasma of the oxygen-containing gas is used in the process b following the second processing, oxygen can be added to the reaction precursor formed in the process j, and the protection film having the same composition as the protection film formed by the same method as the ALD method can be formed to have a relatively thin thickness. Furthermore, since the addition of the oxygen gas can be performed during the etching of the process b, high efficiency of the processing can be achieved. Further, in performing the N cycles of the first sequence, since the first sequence including the aforementioned first processing is performed M times and the first sequence including the aforementioned second processing is performed N–M times, it is possible to cope with the formation of various shapes of the groove portion sufficiently.

The second gas may contain oxygen atoms. By way of example, the second gas may contain a carbon dioxide gas or an oxygen gas. As stated above, since the second gas contains the oxygen atoms, in each of the process e and the process i, the reaction precursor of the silicon formed in each of the process c and the process g is bond with the oxygen atoms, so that the protection film of the silicon oxide can be conformally formed. Moreover, in case that the second gas is the carbon dioxide gas, since the second gas contains the carbon atoms, damage caused by the oxygen atoms can be suppressed by the carbon atoms.

The first gas may contain an aminosilane-based gas. As stated above, since the first gas contains the aminosilane-based gas, the reaction precursor of the silicon can be formed along an atomic layer of the main surface of the target object through each of the process c, process f and the process g.

The first gas may contain monoaminosilane. As stated above, by using the first gas containing the monoaminosilane, the reaction precursor of the silicon can be formed through each of the process c, process f and the process g.

The aminosilane-based gas contained in the first gas may include aminosilane having one to three silicon atoms. The aminosilane-based gas contained in the first gas may include aminosilane having one to three amino groups. As stated, the aminosilane having the one to three silicon atoms can be used as the aminosilane-based gas contained in the first gas. Alternatively, the aminosilane having the one to three amino groups can be used as the aminosilane-based gas contained in the first gas.

A film thickness of the protection film formed in the process a may be equal to or larger than 2 nm and equal to or smaller than 8 nm before the process b is performed. As stated above, before the process b is performed, if the film thickness of the protection film formed in the process a is in the range from 2 nm to 8 nm, the etching effect upon the corner portion of the target object covered with the protection film can be reduced, as compared to the case where the film thickness of the protection film is below 2 nm, particularly. Thus, the degree of deformation of the target object caused by the etching of the process b can be reduced.

According to the exemplary embodiments as described above, in forming the pattern on the target object, it is possible to provide a technique capable of coping with the formation of various shapes of patterns as well as achieving miniaturization of the patterns to meet a trend of higher integration.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A is a flowchart for describing major processes of a method according to an exemplary embodiment;

FIG. 1B is a flowchart for specifically describing a part of the processes shown in FIG. 1A; and FIG. 1C is another flowchart for specifically describing a part of the processes shown in FIG. 1A;

DETAILED DESCRIPTION

Figure 2:
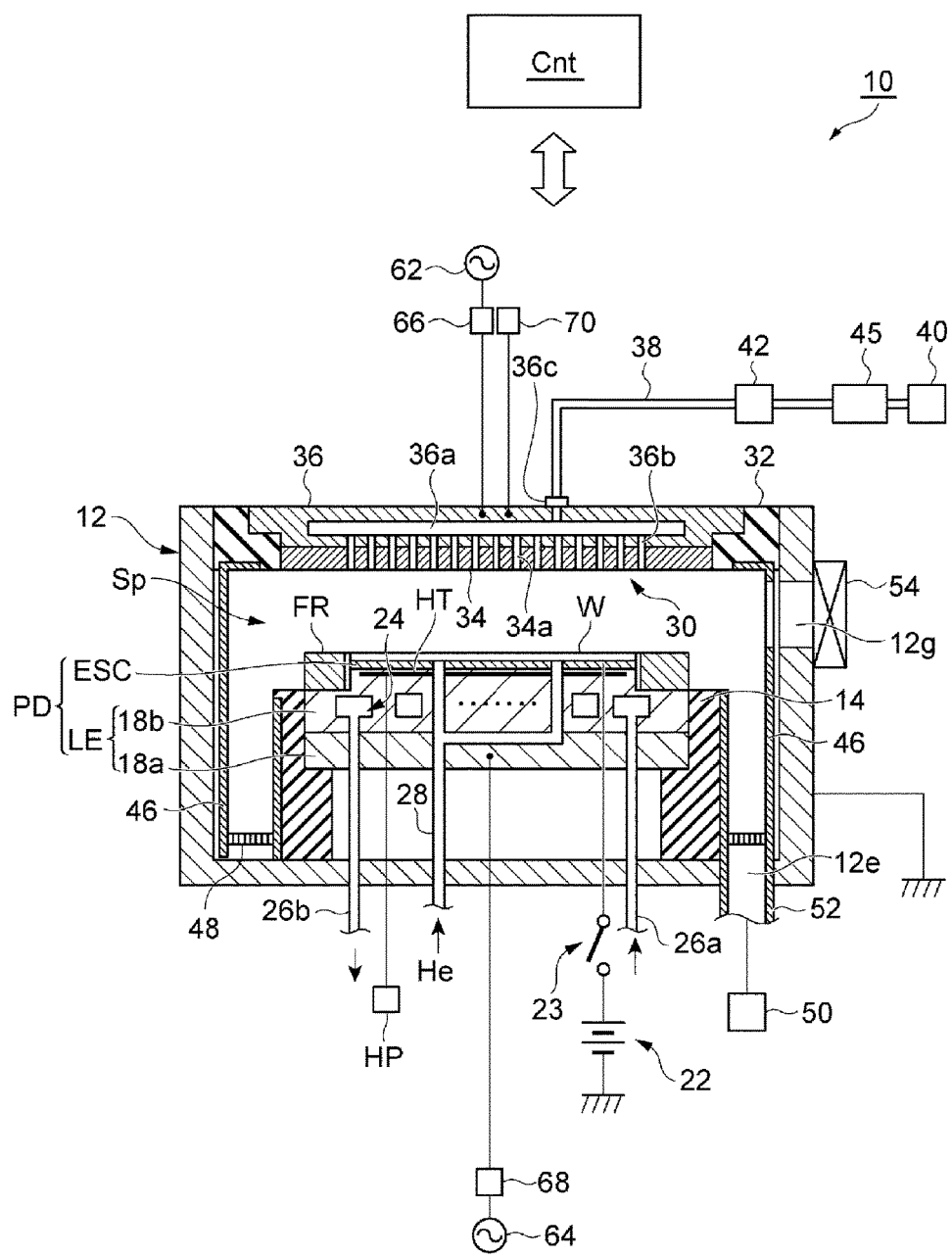
FIG. 2 is a diagram illustrating an example of a plasma processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. Same or corresponding parts in the various drawings will be assigned same reference numerals.

FIG. 1A to FIG. 1C are flowcharts for describing a method according to an exemplary embodiment. A method MT of the present exemplary embodiment shown in FIG. 1A to FIG. 1C is directed to processing a target object (hereinafter, referred to as "wafer"). The method MT includes, as shown in FIG. 1A, a sequence SQ1 (a first sequence). The sequence SQ1 includes a process ST1 and a process ST2. The method MT further includes a process ST3. The process ST1 may include a process ST1a (a first processing) shown in FIG. 1B. The process ST1 may include a process ST1b (a second processing) shown in FIG. 1C. Further, though the method MT of the present exemplary embodiment can be performed by using a single plasma processing apparatus (a plasma processing apparatus 10 to be described later), it may be also possible to use a plurality of plasma processing apparatuses 10 for the individual processes of the method MT.

FIG. 2 is a diagram showing an example of a plasma processing apparatus. FIG. 2 schematically illustrates a cross sectional configuration of the plasma processing apparatus 10 which can be used in various exemplary embodiments of processing a target object. As depicted in FIG. 2, the plasma processing apparatus 10 is configured as a capacitively coupled plasma etching apparatus.

The plasma processing apparatus 10 includes a processing vessel 12, an exhaust opening 12e, a carry-in/out opening 12g, a supporting member 14, a placing table PD, a DC power supply 22, a switch 23, a coolant path 24, a pipeline 26a, a pipeline 26b, an upper electrode 30, an insulating shield member 32, an electrode plate 34, a gas discharge holes 34a, an electrode supporting body 36, a gas diffusion space 36a, gas through holes 36b, a gas inlet opening 36c, a gas supply line 38, a gas source group 40, a valve group 42, a flow rate controller group 45, a deposition shield 46, a gas exhaust plate 48, a gas exhaust device 50, a gas exhaust line 52, a gate valve 54, a first high frequency power supply 62, a second high frequency power supply 64, a matching device 66, a matching device 68, a power supply 70, a control unit Cnt, a focus ring FR, a heater power supply HP, and a heater HT. The placing table PD is equipped with an electrostatic chuck ESC and a lower electrode LE. The lower electrode LE includes a first plate 18a and a second plate 18b. The processing vessel 12 forms a processing space Sp therein.

The processing vessel 12 has a substantially cylindrical shape. The processing vessel 12 is made of, for example, aluminum. An inner wall surface of the processing vessel 12 is anodically oxidized. The processing vessel 12 is frame-grounded.

The supporting member 14 is provided on a bottom portion of the processing vessel 12 inside the processing vessel 12. The supporting member 14 has a substantially cylindrical shape. The supporting member 14 is made of, by way of example, an insulating material. The insulating material forming the supporting member 14 may contain oxygen, for example, quartz. Within the processing vessel 12, the supporting member 14 is vertically extended from the bottom portion of the processing vessel 12.

The placing table PD is provided within the processing vessel 12. The placing table PD is supported by the supporting member 14. The placing table PD holds a wafer W on a top surface thereof. The wafer W is the target object. The placing table PD is equipped with the lower electrode LE and the electrostatic chuck ESC.

The lower electrode LE includes the first plate 18a and the second plate 18b. The first plate 18a and the second plate 18b are made of a metal such as, but not limited to, aluminum. The first plate 18a and the second plate 18b have a substantially disc shape. The second plate 18b is provided on the first plate 18a and electrically connected to the first plate 18a.

The electrostatic chuck ESC is provided on the second plate 18b. The electrostatic chuck ESC has a pair of insulating layers or insulating sheets; and an electrode, which serves as a conductive film, embedded therebetween. The electrode of the electrostatic chuck ESC is electrically connected to the DC power supply 22 via the switch 23. The electrostatic chuck ESC attracts the wafer W by an electrostatic force such as a Coulomb force generated by a DC voltage applied from the DC power supply 22. With this configuration, the electrostatic chuck ESC is capable of holding the wafer W.

The focus ring FR is placed on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. By way of example, the focus ring FR may be formed of quartz.

The coolant path 24 is provided within the second plate 18b. The coolant path 24 constitutes a temperature controller. A coolant is supplied into the coolant path 24 from a chiller unit provided outside the processing vessel 12 via the pipeline 26a. The coolant supplied into the coolant path 24 is then returned back into the chiller unit via the pipeline 26b. In this way, the coolant is supplied into the coolant path 24 to be circulated therein. A temperature of the wafer W held by the electrostatic chuck ESC is controlled by adjusting a temperature of the coolant. Through the gas supply line 28, a heat transfer gas, e.g., a He gas, is supplied from a heat transfer gas supply device into a gap between a top surface of the electrostatic chuck ESC and a rear surface of the wafer W.

The heater HT is a heating device. By way of non-limiting example, the heater HT is buried in the second plate 18b. The heater HT is connected to a heater power supply HP. As a power is supplied to the heater HT from the heater power supply HP, a temperature of the placing table PD is adjusted, so that a temperature of the wafer W placed on the placing table PD is adjusted. Further, the heater HT may be embedded in the electrostatic chuck ESC.

The upper electrode 30 is provided above the placing table PD, facing the placing table PD. The lower electrode LE and the upper electrode 30 are arranged to be substantially parallel to each other. Provided between the upper electrode 30 and the lower electrode LE is the processing space Sp in which a plasma processing is performed on the wafer W.

The upper electrode 30 is supported at an upper portion of the processing vessel 12 with the insulating shield member 32 therebetween. The insulating shield member 32 is made of an insulating material and may contain oxygen for example, but not limited to, quartz. The upper electrode 30 may include the electrode plate 34 and the electrode supporting body 36. The electrode plate 34 faces the processing space Sp, and is provided with a multiple number of gas discharge holes 34a. In the exemplary embodiment, the electrode plate 34 may be made of silicon. In another exemplary embodiment, the electrode plate 34 may be made of silicon oxide.

The electrode supporting body 36 is configured to support the electrode plate 34 in a detachable manner, and is made of a conductive material such as, but not limited to, aluminum. The electrode supporting body 36 may have a water-cooling structure. The gas diffusion space 36a is formed within the electrode supporting body 36. The multiple gas through holes 36b are extended downwards (towards the placing table PD) from the gas diffusion space 36a, and these gas through holes 36b respectively communicate with the gas discharge holes 34a.

Through the gas inlet opening 36c, a processing gas is introduced into the gas diffusion space 36a. This gas inlet opening 36c is provided at the electrode supporting body 36 and connected with the gas supply line 38.

The gas source group 40 is connected to the gas supply line 38 via the valve group 42 and the flow rate controller group 45. The gas source group 40 includes a plurality of gas sources. These gas sources may include a source of an aminosilane-based gas, a source of a fluorocarbon gas (hydrofluorocarbon gas), a source of an oxygen ($O_2$) gas, a source of an inert gas, a source of a rare gas and a source of a carbon dioxide gas. As the aminosilane-based gas (which is contained in the first gas G1 to be described later), one having a molecular structure with a relatively small number of amino groups may be used. By way of non-limiting example, monoaminosilane ($H_3$—Si—R (R denotes an amino group which contains an organic group and may be substituted)) may be used. The aforementioned aminosilane-based gas (which is contained in the first gas G1 to be described later) may include aminosilane having one to three silicon atoms and aminosilane having one to three amino groups. The aminosilane having the one to three silicon atoms may be monosilane (monoaminosilane) having one to three amino groups, disilane having one to three amino groups, or trisilane having one to three amino groups. Further, the aforementioned aminosilane may have an amino group which may be substituted. The amino group may be substituted with any one of a methyl group, an ethyl group, a propyl group or a butyl group. Furthermore, the aforementioned methyl group, the ethyl group, the propyl group or the butyl group may be substituted with a halogen. The fluorocarbon gas may be implemented by, by way of example, but not limitation, a $CF_4$ gas, a $C_4F_6$ gas, a $C_4F_8$ gas, or the like. The inert gas may be implemented by, for example, a nitrogen ($N_2$) gas or the like. The rare gas may be implemented by, for example, an Ar gas, or the like.

The valve group 42 includes a multiple number of valves, and the flow rate controller group 45 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 45. Accordingly, in the plasma processing apparatus 10, it is possible to supply a gas from one or more gas sources selected from the plurality of gas sources belonging to the gas source group 40 into the processing vessel 12 at individually controlled flow rate(s). Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with $Y_2O_3$ or the like. Besides the $Y_2O_3$, the deposition shield may be made of an oxygen-containing material such as, but not limited to, quartz.

At a bottom side of the processing vessel 12, the gas exhaust plate 48 is provided between the supporting member 14 and a side wall of the processing vessel 12. The gas exhaust plate 48 may be made of, by way of example, an aluminum member coated with ceramic such as $Y_2O_3$ or the like. The gas exhaust opening 12e is provided in the processing vessel 12 under the gas exhaust plate 48. The gas exhaust opening 12e is connected with the gas exhaust device 50 via the gas exhaust line 52. The gas exhaust device 50 includes a vacuum pump such as a turbo molecular pump, and is capable of decompressing the space within the processing vessel 12 to a required vacuum level. Through the carry-in/out opening 12g, the wafer W is carried into or out of the processing vessel 12. The carry-in/out opening 12g is provided at the side wall of the processing vessel 12, and the carry-in/out opening 12g is opened or closed by the gate valve 54.

The first high frequency power supply 62 is configured to generate a first high frequency power for plasma generation, for example, a high frequency power of 40 MHz having a frequency ranging from 27 MHz to 100 MHz. The first high frequency power supply 62 is connected to the upper electrode 30 via the matching device 66. The matching device 66 is a circuit configured to match an output impedance of the first high frequency power supply 62 and an input impedance at a load side (lower electrode LE side). The first high frequency power supply 62 may be connected to the lower electrode LE via the matching device 66.

The second high frequency power supply 64 is configured to generate a second high frequency power for attracting ion into the wafer W, that is, a high frequency bias power. By way of example, the second high frequency power supply 64 generates a high frequency bias power of 3.2 MHz having a frequency ranging from 400 kHz to 40.68 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side). Further, the power supply 70 is connected to the upper electrode 30. The power supply 70 is configured to apply, to the upper electrode 30, a voltage for attracting positive ions within the processing space Sp into the electrode plate 34. As an example, the power supply 70 is a DC power supply configured to generate a negative DC Voltage. If such a voltage is applied to the upper electrode 30 from the power supply 70, the positive ions existing within the processing space Sp collide with the electrode plate 34. As a result, secondary electrons and/or silicon is released from the electrode plate 34.

The control unit Cnt is implemented by a computer including a processor, a storage unit, an input device, a display device, and so forth, and is configured to control individual components of the plasma processing apparatus 10. To elaborate, the control unit Cnt is connected to the valve group 42, the flow rate controller group 45, the gas exhaust device 50, the first high frequency power supply 62, the matching device 66, the second high frequency power supply 64, the matching device 68, the power supply 70, the heater power supply HP and the chiller unit.

The control unit Cnt is operated to output control signals according to a program based on an input recipe. The selection of the gas supplied from the gas source group and a flow rate of the selected gas, the gas exhaust of the gas exhaust device 50, power supplies from the first and second high frequency power supplies 62 and 64, application of the voltage from the power supply 70, the power supply of the heater power supply HP, the control of the flow rate and the temperature of the coolant from the chiller unit can be achieved in response to the control signals from the control unit Cnt. Further, individual processes of the method MT (shown in FIG. 1) of processing a target object according to the present exemplary embodiment can be performed as the individual components of the plasma processing apparatus 10 are operated under the control of the control unit Cnt.

Figure 3:
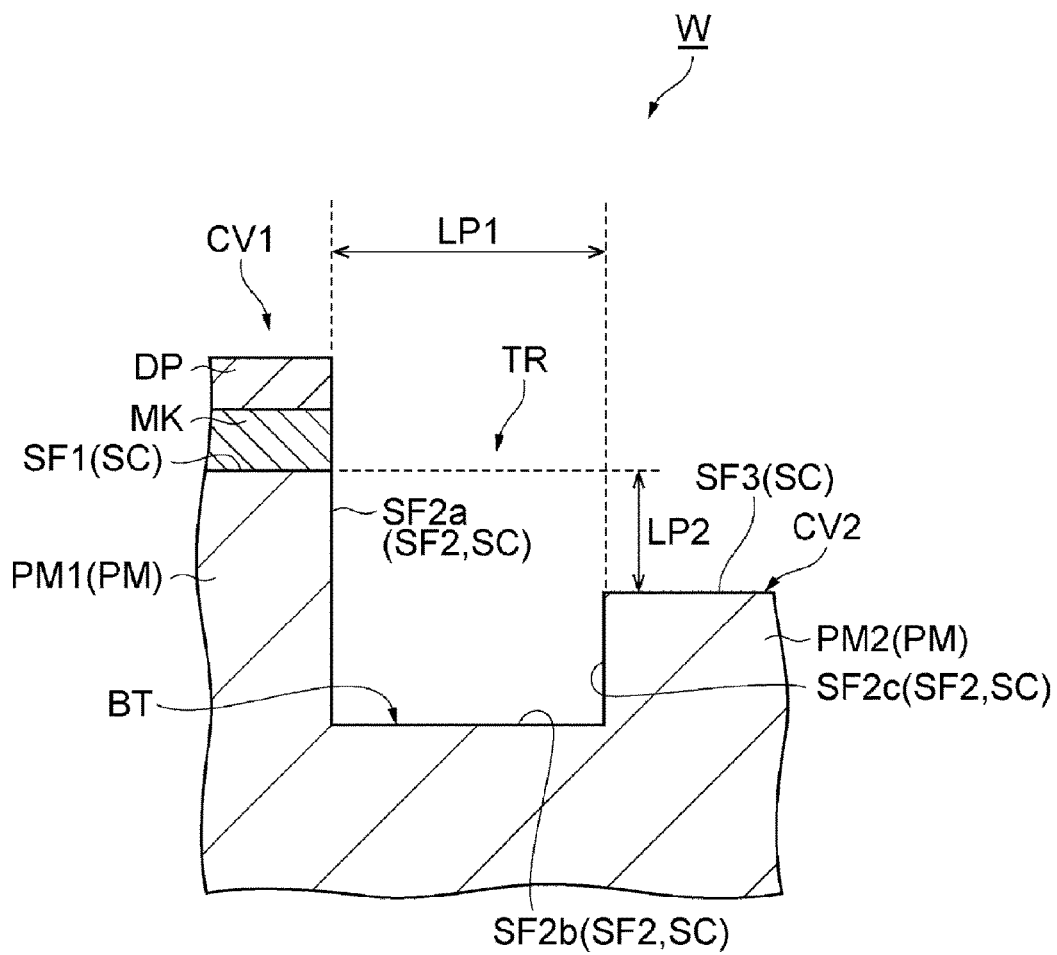
FIG. 3 is a cross sectional view illustrating a state of a target object before the individual processes shown in FIG. 1A to FIG. 1C are performed.
Figure 4A:
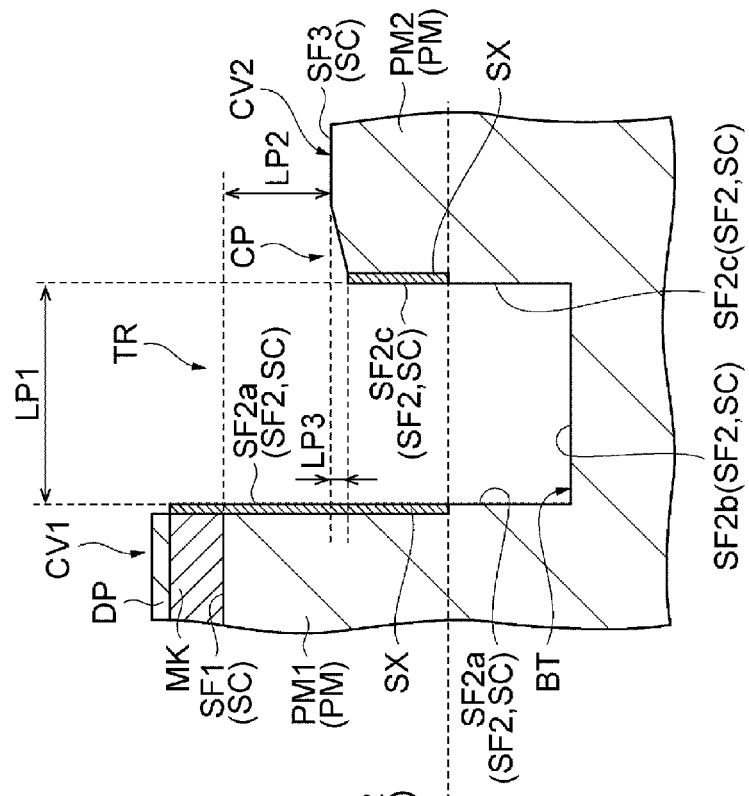
FIG. 4A and FIG. 4B are cross sectional views sequentially illustrating states of the target object after the individual processes shown in FIG. 1A to FIG. 1C are performed.
Figure 4B:
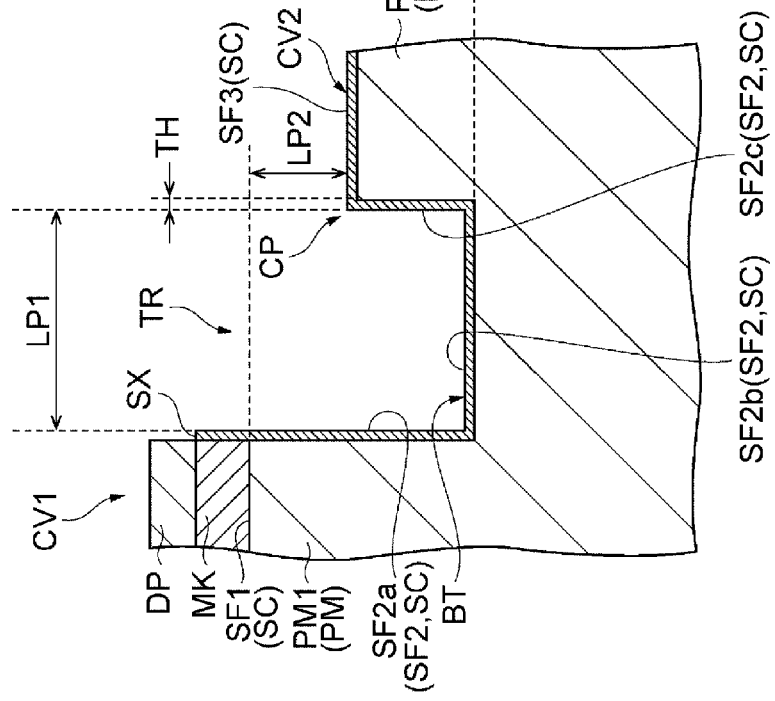
Figure 5A:
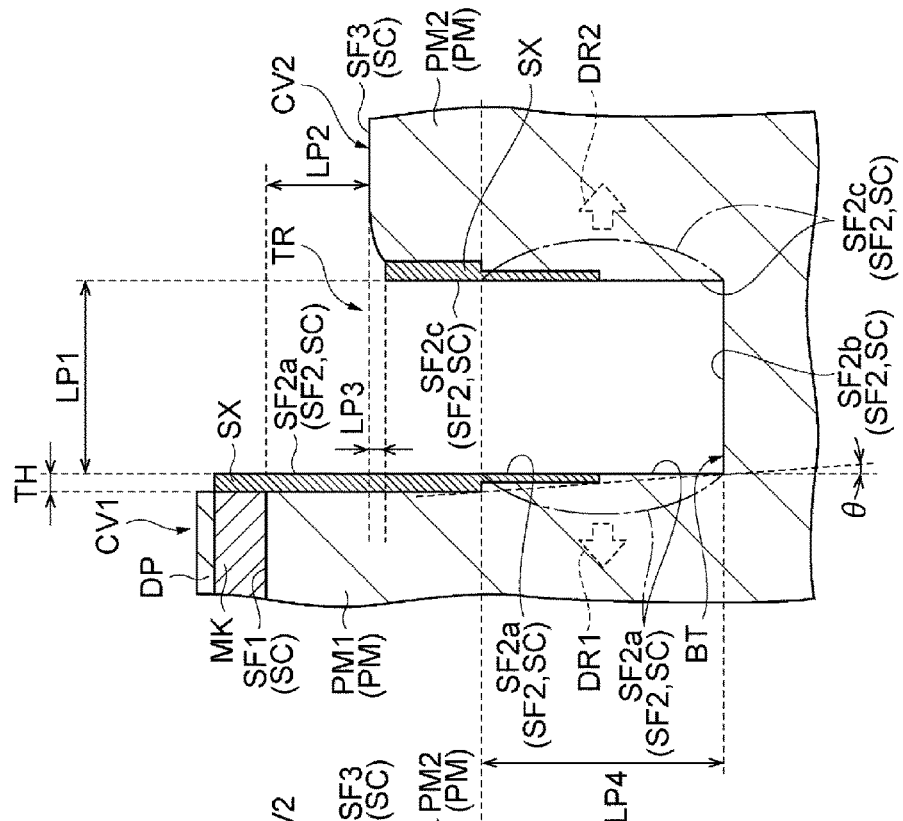
FIG. 5A and FIG. 5B are cross sectional views sequentially illustrating states of the target object after the individual processes shown in FIG. 1A to FIG. 1C are performed.
Figure 5B:
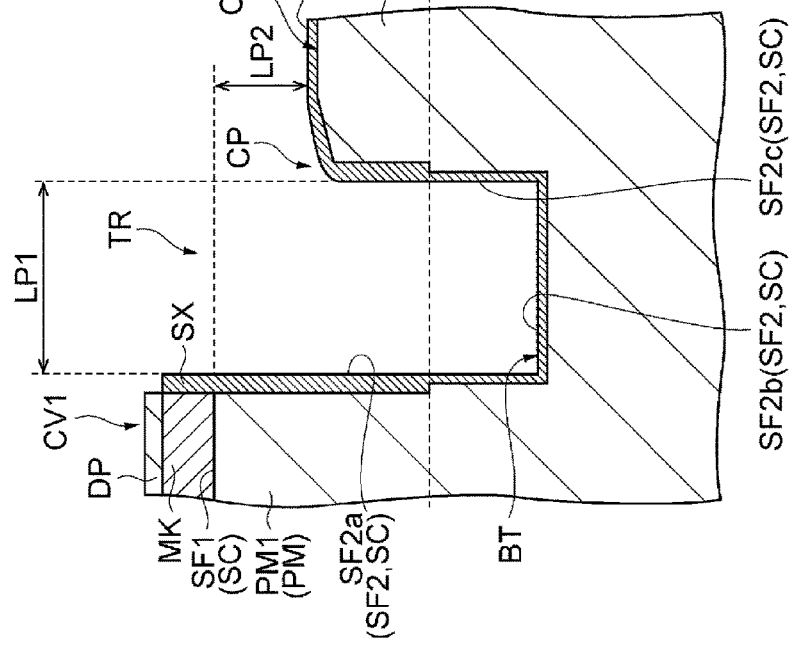
Figure 6A:
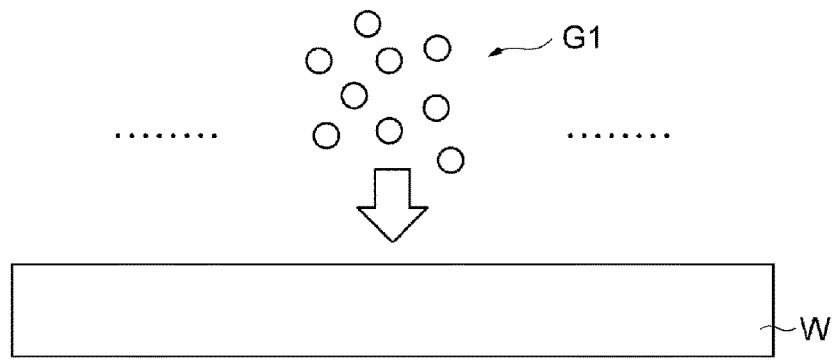
FIG. 6A to FIG. 6C are diagrams sequentially and schematically illustrating formation of a protection film in performing a sequence of forming the protection film shown in FIG. 1A to FIG. 1C.
Figure 6B:
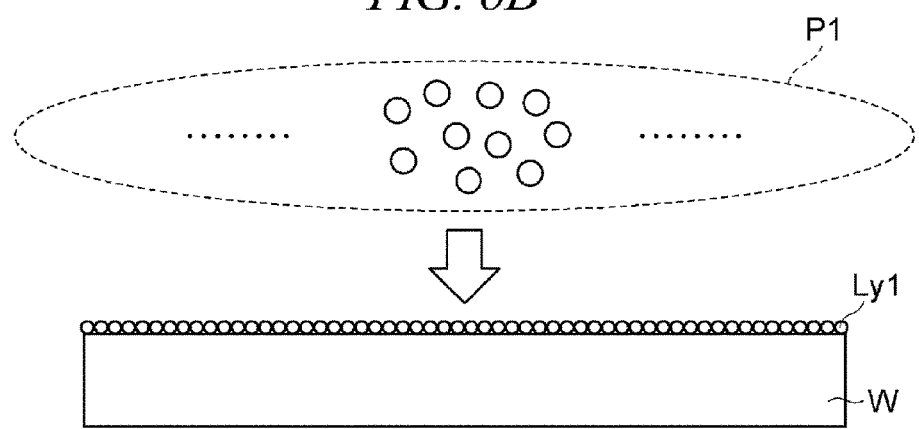
Figure 6C:
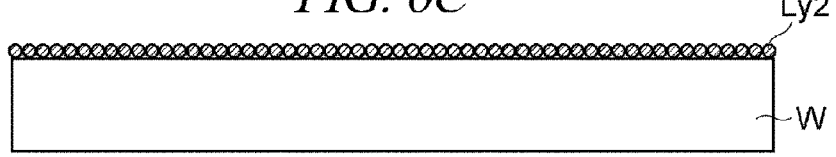

Now, referring back to FIG. 1A to FIG. 1C, the method MT will be discussed in detail. In the following, an example where the plasma processing apparatus 10 is used to perform the method MT will be explained. The following description refers to FIG. 3 to FIG. 7 as well as FIG. 1A to FIG. 1C and FIG. 2. FIG. 3 is a cross sectional view illustrating a state of a target object before individual processes shown in FIG. 1A to FIG. 1C are performed. FIG. 4A and FIG. 4B are cross sectional views sequentially illustrating states of the target object after the individual processes shown in FIG. 1A to FIG. 1C are performed. FIG. 5A and FIG. 5B are cross sectional views sequentially illustrating states of the target object after the individual processes shown in FIG. 1A to FIG. 1C are performed. FIG. 6A to FIG. 6C are schematic diagrams sequentially illustrating formation of a protection film in performing a sequence of forming the protection film shown in FIG. 1A to FIG. 1C.

Prior to performing the method MT shown in FIG. 1A to FIG. 1C, a wafer W shown in FIG. 3 is carried into the processing vessel 12. The wafer W illustrated in FIG. 3 is an example of the target object to which the method MT of FIG. 1A to FIG. 1C is applied. The wafer W shown in FIG. 3 is a substrate product formed through a dual damascene etching process. The wafer W shown in FIG. 3 has a protrusion portion CV1 (first protrusion portion), a protrusion portion CV2 (second protrusion portion), an etching target layer PM and a groove portion TR. The etching target layer PM includes a region PM1 belonging to the protrusion portion CV1 and a region PM2 belonging to the protrusion portion CV2. The groove portion TR is provided on a main surface SC of the wafer W. The groove portion TR is provided at the etching target layer PM. The groove portion TR is defined by the protrusion portion CV1 and the protrusion portion CV2.

The wafer W depicted in FIG. 3 further includes a mask MK and a deposition film DP. The mask MK is provided on the region PM1. Specifically, the mask MK is provided on an end surface SF1 of the region PM1 (that is, an interface between the region PM1 and the mask MK). The deposition film DP is provided on the mask MK.

An inner surface SF2 of the groove portion TR includes a surface SF2*a*, a surface SF2*b* and a surface SF2*c*. The etching target layer PM includes the end surface SF1 and the surface SF2*a* at the protrusion portion CV1. The surface SF2*a* is a part of the surface SF2 at the side of the protrusion portion CV1. The surface SF2*b* is located at a bottom portion BT of the groove portion TR. That is, the surface SF2*b* is a bottom surface of the groove portion TR. The surface SF2*c* is a part of the surface SF2 at the side of the protrusion portion CV2 and faces the surface SF2*a*. The etching target layer PM includes the surface SF2*c* and an end surface SF3 at the protrusion portion CV2. The end surface SF1, the surface SF2 and the end surface SF3 belong to the main surface SC of the wafer W.

A width LP1 of the groove portion TR is a distance between the surface SF2*a* and the surface SF2*c* and is, for example, 3 nm to 5 nm. A height difference LP2 is a distance between the end surface SF1 and the end surface SF3. A plane including the end surface SF1 is located above the end surface SF3. In this case, the height difference LP2 has a positive value. By performing the method MT, the region PM2 of the etching target layer PM at the protrusion portion CV2 is etched from a side of the end surface SF3, so that the height difference LP2 is increased.

The etching target layer PM is a porous film provided with a multiple number of holes. The etching target layer PM has a low dielectric constant (low-k). The etching target layer PM may be made of, by way of non-limiting example, SiOCH. The mask MK may be made of, by way of example, but not limitation, TiN. The deposition film DP may be made of, for example, CF.

Referring back to FIG. 1A to FIG. 1C, in the method MT, a sequence SQ1 is performed one or more times. A series of processes from the start of the sequence SQ1 to a process ST3 (process ST3: YES) to be described later is an etching process for obtaining a required shape of the groove portion TR of the etching target layer PM. After the wafer W shown in FIG. 3 is carried in, the sequence SQ1 is performed. In the method MT, the sequence SQ1 is repeatedly performed N times (N is an integer equal to or lager than 2). The sequence SQ1 includes a process ST1 and a process ST2. The process ST1 is performed to form a protection film SX conformally on the main surface SC of the wafer W within the processing vessel 12 of the plasma processing apparatus 10 in which the wafer W is accommodated. An example of the process ST1 is a process ST1*a* shown in FIG. 1B. Another example of the process ST1 is a process ST1*b* shown in FIG. 1C.

The process ST1*a* includes a sequence SQ1*a* (second sequence). The sequence SQ1*a* includes a process ST11*a*, a process ST12*a*, a process ST13*a* and a process ST14*a*.

Between the process ST1*a* and the process ST1*b*, the process ST1*a* will be first explained with reference to FIG. 1B. The process ST1*a* includes the sequence SQ1*a*. The sequence SQ1a includes the process ST11a, the process ST12a, the process ST13a and the process ST14a. The process ST1a further includes a process ST15a.

In the process ST1a, the sequence SQ1a is performed one or more times. A series of processes from the start of the sequence SQ1a to the process ST15a (process ST15a: YES) to be described later is a process of forming the protection film SX conformally on the main surface SC (particularly, the surface SF2a, the surface SF2b, the surface SF2c and the end surface SF3) of the wafer W.

First, in the process ST11a, the first gas G1 containing silicon is supplied into the processing vessel 12. The first gas G1 contains an aminosilane-based gas. The first gas G1 is supplied into the processing vessel 12 from a gas source selected from the plurality of gas sources belonging to the gas source group 40. The first gas G1 is an aminosilane-based gas such as, but not limited to, monoaminosilane ($H_3$—Si—R (R denotes an amino group)). In the process ST11a, plasma of the first gas G1 is not generated.

As shown in FIG. 6A, molecules of the first gas G1 adhere to the main surface SC of the wafer W as reaction precursors. The molecules (monoaminosilane) of the first gas G1 adhere to the main surface SC of the wafer W by chemical adsorption based on chemical bonding, and plasma is not used in the process ST11a. Further, a gas other than the monoaminosilane may be used as long as the gas contains silicon and can be attached to the surface of the wafer W by the chemical bonding.

The monoaminosilane-based gas is selected as the first gas G1 because the chemical adsorption of the monoaminosilane can take place relatively easily since it has relatively high electronegativity and a molecular structure with polarity. A layer Ly1 formed as the molecules of the first gas G1 adhere to the main surface SC of the wafer W comes into a state close to a monomolecular layer (monolayer) since the adhesion is achieved by the chemical adsorption. Here, the smaller the amino group R of the monoaminosilane is, the smaller the molecular structure of the molecules adsorbed to the main surface SC of the wafer W may be and, thus, steric hindrance which depends on the size of the molecules may be reduced. Therefore, the molecules of the first gas G1 can be uniformly adsorbed to the main surface SC of the wafer W, so that the layer Ly1 can be formed to have a uniform film thickness on the main surface SC of the wafer W. By way of example, as the monoaminosilane ($H_3$—Si—R) contained in the first gas G1 reacts with OH groups on the main surface SC of the wafer W, $H_3$—Si—O as the reaction precursors are formed, so that the layer Ly1 formed of the monolayer of $H_3$—Si—O is obtained. Thus, the layer L1y of the reaction precursor is formed on the main surface SC of the wafer W conformally to have a uniform film thickness without being affected by a pattern density of the wafer W.

In the process ST12a following the process ST11a, the space within the processing vessel 12 is purged. To elaborate, the first gas G1 supplied in the process ST11a is exhausted. In the process ST12a, an inert gas such as a nitrogen gas may be supplied into the processing vessel 12 as a purge gas. That is, the purging in the process ST12a may be implemented by a gas purging of allowing the inert gas to flow in the processing vessel 12 or a purging by vacuum evacuation. In the process ST12a, surplus molecules adhering to the wafer W may be removed. Through the processes as stated above, the layer Ly1 of the reaction precursor is formed to be a very thin monolayer.

In the process ST13a following the process ST12a, plasma P1 of a second gas is generated within the processing vessel 12. To elaborate, the second gas containing a carbon dioxide gas is supplied into the processing vessel 12 from a gas source selected from the plurality of gas sources belonging to the gas source group 40. The second gas may be another gas containing oxygen atoms besides the carbon dioxide gas. By way of non-limiting example, the second gas may be an oxygen gas. The high frequency power is supplied from the first high frequency power supply 62. At this time, the second high frequency power supply 64 may also apply the bias power. Further, it may be also possible to generate the plasma by using only the second high frequency power supply 64 without using the first high frequency power supply 62. By operating the gas exhaust device 50, the pressure of the space within the processing vessel 12 is set to a preset pressure.

The molecules (constituting the monolayer of the layer Ly1) adhering to the surface of the wafer W through the process ST11a as stated above includes a bond between silicon and hydrogen. A binding energy of the silicon and the hydrogen is lower than a binding energy of silicon and oxygen. Accordingly, as illustrated in FIG. 6B, if the plasma P1 of the second gas containing the carbon dioxide gas is generated, active species of the oxygen, for example, oxygen radicals are generated, and the hydrogen of the molecules constituting the monolayer of the layer Ly1 is substituted with oxygen, so that a layer Ly2 of silicon oxide film (for example, a $SiO_2$ film) is formed as a monolayer, as illustrated in FIG. 6C.

In the process ST14a following the process ST13a, the space within the processing vessel 12 is purged. To elaborate, the second gas supplied in the process ST13a is exhausted. In the process ST14a, an inert gas such as a nitrogen gas may be supplied into the processing vessel 12 as a purge gas. That is, the purging in the process ST14a may be implemented by the gas purging of allowing the inert gas to flow in the processing vessel 12 or the purging by vacuum evacuation.

In the above-described sequence SQ1a, the purging is performed in the process ST12a, and the hydrogen of the molecules constituting the layer Ly1 is substituted with the oxygen in the process ST13a following the process ST12a. Accordingly, the same as in an ALD method, by performing the single cycle of the sequence SQ1a, the layer Ly2 of the silicon oxide film can be conformally formed on the main surface SC of the wafer W in a thin uniform film thickness.

In the process ST15a following the sequence SQ1a, it is determined whether or not to finish the repetition of the sequence SQ1a. To elaborate, in the process ST15a, it is determined whether the repetition number of the sequence SQ1a has reached a preset number. Determining the repetition number of the sequence SQ1a is determining a film thickness TH of the protection film SX, which is the silicon oxide film, shown in FIG. 4A. That is, the thickness of the protection film SX finally formed on the wafer W is determined by a product of the film thickness of the silicon oxide film formed through a single cycle of the sequence SQ1a and the repetition number of the sequence SQ1a. Accordingly, the repetition number of the sequence SQ1a is set based on the required thickness of the protection film SX formed on the wafer W.

If it is determined in the process ST15a that the repetition number of the sequence SQ1a has not reached the preset number (process ST15a: NO), the sequence SQ1a is repeated. Meanwhile, if it is determined in the process ST15a that the repetition number of the sequence SQ1a has reached the preset number (process ST15a: YES), the repetition of the sequence SQ1a is finished. As a result, the protection film SX of the silicon oxide film is formed on the main surface SC of the wafer W, as illustrated in FIG. 4A. That is, as the sequence SQ1a is repeatedly performed the preset number of times, the protection film SX having the preset film thickness is conformally formed on the main surface SC of the wafer W in the uniform thickness. The thickness of the protection film SX is reduced as the repetition number of the sequence SQ1a is decreased.

Referring back to FIG. 1A to FIG. 1C, in the process ST2 following the process ST1, the bottom portion BT (surface SF2b) of the groove portion TR is etched by plasma generated within the processing vessel 12. First, in the process ST2, a mixed gas of a third gas and a fourth gas is supplied into the processing vessel 12. The third gas may be a processing gas containing a fluorocarbon-based gas, and the fourth gas may be a processing gas containing an oxygen gas. The third gas may be, by way of non-limiting example, a $C_4F_8$ gas. The fourth gas may be, by way of example, but not limitation, $Ar/N_2/O_2$. Plasma of the mixed gas supplied into the processing vessel 12 is generated within the processing vessel 12. To elaborate, a processing gas containing the mixed gas of the third gas and the fourth gas is supplied into the processing vessel 12 from a gas source selected from the plurality of gas sources belonging to the gas source group 40. The high frequency power is supplied from the first high frequency power supply 62, and the high frequency bias power is supplied from the second high frequency power supply 64. Further, by operating the gas exhaust device 50, the internal pressure of the space within the processing vessel 12 is set to a preset pressure. As a result, the plasma of the mixed gas of the third gas and the fourth gas is generated. Active species of F (fluorine) contained in the plasma generated in the process ST2 etch the bottom portion BT of the groove portion TR of the etching target layer PM which is the porous film. Subsequently, the space within the processing vessel 12 is purged. To be specific, the processing gas supplied in the process ST2 is exhausted from the inside of the processing vessel 12. An inert gas such as a nitrogen gas may be supplied into the processing vessel 12 as a purge gas. That is, the purging performed in the process ST2 may be the gas purging of allowing the inert gas to flow into the processing vessel 12 or the purging by vacuum evacuation.

As depicted in FIG. 4B, a depth of the groove portion TR is increased by performing the single cycle of the sequence SQ1. Further, since the region PM2 of the etching target layer PM at the protrusion portion CV2 is etched from a side of the end surface SF3 through this single cycle of the sequence SQ1, a corner portion CP of the protrusion portion CV2 is removed (chamfered) by this etching. That is, after the single cycle of the sequence SQ1 is conducted, there may be generated a height LP3 (a height of the removed portion of the corner portion CP) between a tip end of the end surface SF3 of the region PM2 and an end surface of the protection film SX provided on the surface SF2c of the groove portion TR at the side of the protrusion portion CV2. The height LP3 that may be generated in the method MT can be reduced by adjusting processing conditions such as a thickness of the protection film SX and an etching time. In the following description, the term "removed portion" refers to a portion removed by etching.

Figure 7:
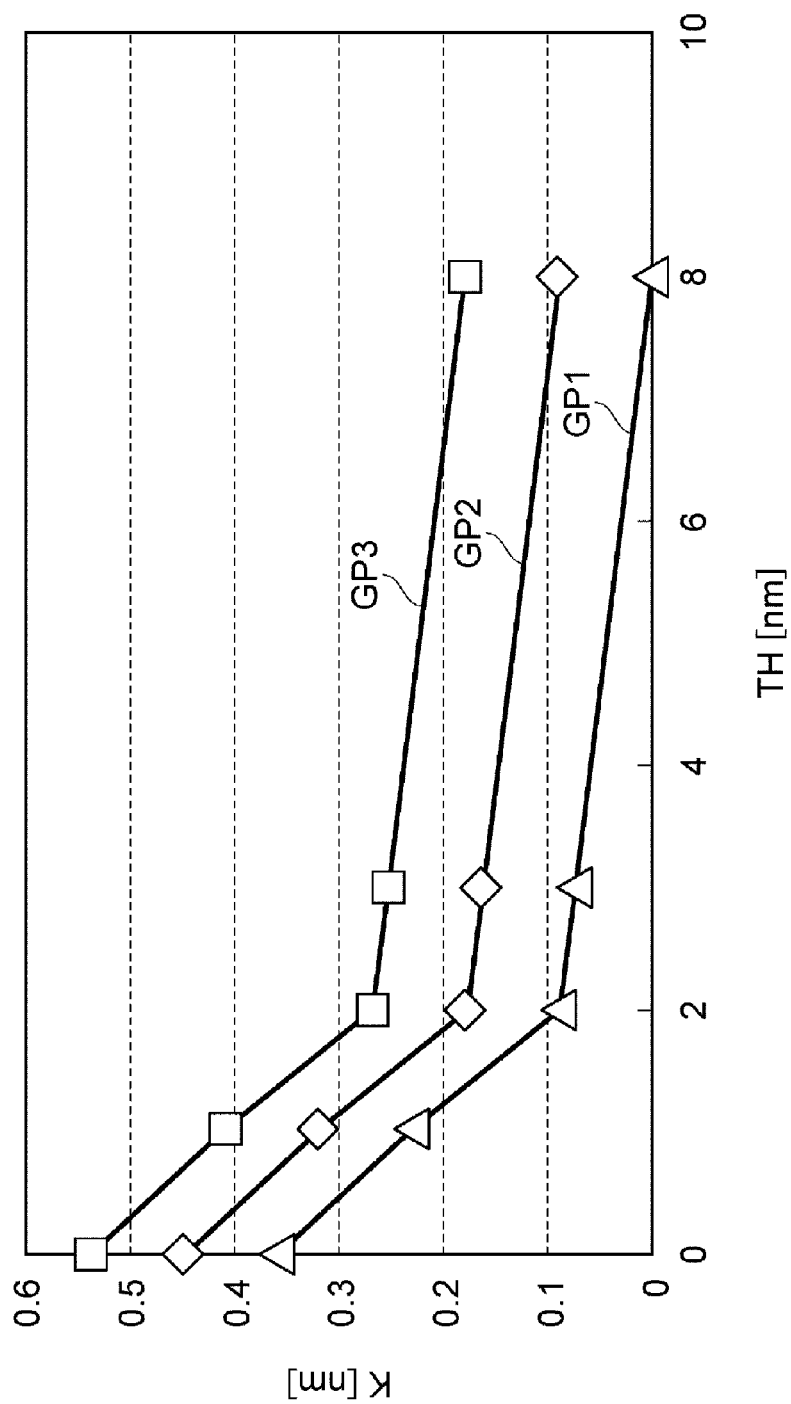
FIG. 7 is a diagram showing an example of a measurement result showing a correspondence between a film thickness of the protection film shown in FIG. 4A and a height of a corner portion of an etching target layer formed by etching shown in FIG. 4B.

FIG. 7 is a diagram showing an example of a measurement result of a correspondence between a film thickness TH of the protection film SX shown in FIG. 4A and the height LP3 of the corner portion CP after the etching shown in FIG. 4B. A vertical axis of FIG. 7 represents an increment K (nm) of the removed portion of the corner portion CP (that is, an increment of the height LP3) in the etching of 1 nm in the process ST2, and a horizontal axis of FIG. 7 indicates a value (nm) of the film thickness TH of the protection film SX provided on the surface SF2c of the groove portion TR at the side of the protrusion portion CV2 before the etching of the process ST2. A result GP1 is a measurement result obtained when the high frequency bias power supplied from the second high frequency power supply 64 is 0 W; a result GP2, a measurement result obtained when the high frequency bias power supplied from the second high frequency power supply 64 is 25 W; and a result GP3, a measurement result obtained when the high frequency bias power supplied from the second high frequency power supply 64 is 100 W.

Referring to FIG. 7, the increment K of the removed portion of the corner portion CP (that is, the increment of the height LP3) that has occurred in the etching of 1 nm in the process ST2 is found to increase with a decrease of the film thickness TH of the protection film SX provided on the surface SF2c of the groove portion TR at the side of the protrusion portion CV2 and with an increase of the high frequency bias power supplied from the second high frequency power supply 64. Further, in case that a DC voltage is supplied from the power supply 70 in the process ST2, the increment K of the removed portion of the corner portion CP (that is, the increment of the height LP3) in the etching of 1 nm is found to increase with a rise of the corresponding DC voltage.

Further, in any of the results GP1 to GP3, a variation of the increment K of the removed portion of the corner portion CP (the increment of the height LP3) with respect to a variation of the film thickness TH (that is, an inclination of each graph of the results GP1 to GP3) is found to be larger when the film thickness TH of the protection film SX is equal to or less than 2 nm as compared to a case when the film thickness TH of the protection film SX is larger than 2 nm. Accordingly, as can be seen from FIG. 7, if the film thickness TH of the protection film SX before the process ST2 is in the range form 2 nm to 8 nm, the removed portion of the corner portion CP caused in the etching of the process ST2 can be reduced, and the height LP3 of the removed portion of the corner portion CP can be reduced. Thus, degree of deformation of the etching target layer PM caused by the etching of the method MT can be reduced.

Now, the degree of anisotropy of the etching in the process ST2 will be explained. Assuming that an etching rate in a vertical direction (a depth direction of the groove portion TR) is Y1 (nm/min) and an etching rate in a horizontal direction (a direction which is perpendicular to the vertical direction and in which the main surface SC of the wafer W is expanded) is Y2 (nm/min), there is satisfied a relationship of $\alpha=Y2/Y1$, $0<\alpha<1$, which implies that the smaller the a is, the higher the anisotropy of the etching in the vertical direction may be. The value a is decreased with an increase of the high frequency bias power supplied from the second high frequency power supply 64, and, also, is decreased with an increase of the internal pressure of the processing vessel 12. As stated, the degree of the anisotropy of the etching in the process ST2 can be appropriately controlled by adjusting the high frequency bias power supplied from the second high frequency power supply 64 and the internal pressure of the processing vessel 12.

Now, referring to FIG. 1C, a case where the process ST1b is used as the process ST1 shown in FIG. 1A will be explained. The process ST1b is an example of the process ST1 shown in FIG. 1A. The process ST1b includes a process ST11b and a process ST12b. A processing detail of the process ST11b is the same as the processing detail of the process ST11a. A processing detail of the process ST12b is the same as the processing detail of the process ST12a. That is, as depicted in FIG. 4A, the protection film SX formed on the main surface SC of the wafer W through the process ST1b is the layer Ly1. Accordingly, in case that the process ST1b is used as the process ST1, the film thickness of the protection film SX formed through the single cycle of the sequence SQ1 becomes equal to the film thickness of the protection film (layer Ly2) formed through the single cycle of the sequence SQ1a.

In case that the process ST1b is used as the process ST1, the formation of the layer Ly2 (see FIG. 6C) by the plasma P1 of the second gas containing the oxygen atoms for use in the process ST13a of the process ST1a may be implemented by the etching in the process ST2, as illustrated in FIG. 4B. That is, as the oxygen atoms contained in the fourth gas used in the process ST2 following the process ST1b act the same way as the oxygen atoms used in the process ST13a of the process ST1a, the layer Ly2 is obtained from the layer Ly1. That is, the layer Ly1 is formed through the process ST1b, and the layer Ly2 is formed from the layer Ly1 by the etching of the process ST2 following the process ST1b.

Reference is made back to FIG. 1A. In the method MT, the sequence SQ1 is performed one or more times. In the process ST3 following the sequence SQ1, it is determined whether or not to finish the repetition of the sequence SQL To elaborate, in the process ST3, it is determined whether the repetition number of the sequence SQ1 has reached a preset number. If it is determined in the process ST3 that the repetition number of the sequence SQ1 has not reached the preset number (process ST3: NO), the sequence SQ1 is repeated. Meanwhile, if it is determined in the process ST3 that the repetition number of the sequence SQ1 has reached the preset number (process ST3: YES), the repetition of the sequence SQ1 is finished. As a result, the groove portion TR provided on the main surface SC of the wafer W can be formed to have a desired shape (desired width and depth of the groove portion TR), as illustrated in FIG. 5B. FIG. 4A and FIG. 4B illustrate the states of the wafer W upon the completion of the first cycle of the sequence SQ1, whereas FIG. 5A and FIG. 5B illustrate the states of the wafer W upon the completion of the second cycle of the sequence SQL The shape of the groove portion TR may be determined based on the repetition number of the sequence SQ1. That is, the width of the groove portion TR (that is, the shape of the groove portion TR in a width direction) finally formed on the main surface SC of the wafer W is substantially determined by a product of a film thickness of the silicon oxide film formed by the single cycle of the sequence SQ1 and the repetition number of the sequence SQ1. Further, the depth of the groove portion TR (that is, the shape of the groove portion TR in the depth direction) finally formed on the main surface SC of the wafer W is substantially determined by a product of a depth of the groove portion TR etched by the single cycle of the sequence SQ1 and the repetition number of the sequence SQ1. Thus, the repetition number of the sequence SQ1 is set based on the required shape of the groove portion TR formed on the main surface SC of the wafer W.

Further, if the sequence SQ1 in which the process ST1a of FIG. 1B is used as the process ST1 is included in multiple cycles of the sequence SQ1 repeatedly performed, the detailed shape of the groove portion TR relies on the repetition number of the sequence SQ1a as well as the repetition number of the sequence SQL For example, in case that the sequence SQ1 is performed N times, there may be assumed a case where, among the N cycles of the sequence SQ1, the sequence SQ1 including the process ST1a shown in FIG. 1B is performed M times (M is an integer equal to or larger than 1 and equal to or smaller than N−1) and the sequence SQ1 including the process ST1b shown in FIG. 1C is performed N−M times. Particularly, there may be considered a case where, among the N cycles of the sequence SQ1, the sequence SQ1 including the process ST1a shown in FIG. 1B is first performed a single time, and then, in the second and subsequent cycles, the sequence SQ1 including the process ST1b shown in FIG. 1C is performed N−1 times. In this case, through the first cycle of the sequence SQ1, the protection film SX having a relatively thick film thickness TH can be first formed. If the repetition number of the sequence SQ1 including the process ST1a is relatively large, the etching target layer PM at the side of the surface SF2 of the groove portion TR may be altered by the plasma of the oxygen gas used in the etching of the process ST13a. Further, the deposition film DP may be removed by being etched by the plasma of this oxygen gas. In such a case, as the mask MK is exposed, the shape of the etching target layer PM of the protrusion portion CV1 may be changed by this etching.

Furthermore, referring to FIG. 5B, if the width of the groove portion TR is enlarged (the width LP1 of the groove portion TR is enlarged as the surface SF2a of the groove portion TR is enlarged in a direction DR1 and the surface SF2c of the groove portion TR is enlarged in a direction DR2) in the etching of the process ST2 due to the relatively low anisotropy of the etching of the process ST2, the repetition number N of the sequence SQ1 may be determined based on a required value dp of the depth LP4 of the groove portion TR and a required value lp of the width LP1 of the groove portion TR. Here, the required value dp of depth LP4 of the groove portion TR may be determined based on the value Y1 (nm/min) of the etching rate in the vertical direction, a processing time of each cycle of the sequence SQ1 and a value thy of the film thickness TH of the protection film SX of each cycle of the sequence SQ1. The required value lp of the width LP1 of the groove portion TR may be determined based on the value Y2 (nm/min) of the etching rate in the horizontal direction, the processing time of each cycle of the sequence SQ1 and the value thy of the film thickness TH of the protection film SX of each cycle of the sequence SQL Further, referring to FIG. 5B, if the width (width LP1) of the groove portion TR is maintained in the etching of the process ST2 due to the relatively high anisotropy of the etching of the process ST2, the repetition number N of the sequence SQ1 may be determined by an expression of $N=(dp \times \tan(\theta))/tha$ by using a required value tha (average value) of the film thickness TH which can be formed through the single cycle of the sequence SQ1, the required value dp of the depth LP4 of the groove portion TR and a required shape of the groove portion TR (specifically, an angle $\theta$ shown in FIG. 5B). Here, the required value tha (average value) of the film thickness TH that can be formed through the single cycle of the sequence SQ1 can be determined based on a required value tht (maximum value) of the film thickness TH of the protection film SX formed through the N cycles of the sequence SQ1 and the repetition number N of the sequence SQ1 (tha=tht/N). The required value dp of the depth LP4 of the groove portion TR can be determined based on the value Y1 (nm/min) of the etching rate in the vertical direction, the processing time of each cycle of the sequence SQ1 and the value thy of the film thickness TH of the protection film SX of each cycle of the sequence SQ1. The angle $\theta$ shown in FIG. 5B can be determined based on the required value dp of the depth LP4 of the groove portion TR and the required value tht of the film thickness TH of the protection film SX (tan(θ)=tht/dp).

Below, examples of major processing conditions of the process ST2, the process ST11a, the process ST13a, the sequence SQ1 and the sequence SQ1a are specified.

<Process ST2>
Internal pressure (mTorr) of processing vessel 12: 80 mTorr
Value (W) of high frequency power of first high frequency power supply 62 and value (MHz) of frequency: 300 W, 40 MHz
Value (W) of high frequency power of second high frequency power supply 64 and value (MHz) of frequency: 25 W, 13 MHz
Value (V) of DC voltage of power supply 70: 0 V
Processing gas: $C_4F_8/Ar/N_2/O_2$ gas
Flow rate (sccm) of processing gas: $C_4F_8$ gas: 30 sccm, Ar gas: 1000 sccm, $N_2$ gas: 20 sccm, $O_2$ gas: 10 sccm
Processing time (s): 30 s <Process ST11a>
Internal pressure (mTorr) of processing vessel 12: 100 mTorr
Value (W) of high frequency power of first high frequency power supply 62: 0 W
Value (W) of high frequency power of second high frequency power supply 64: 0 W
Value (V) of DC voltage of power supply 70: 0 V
Processing gas (first gas): monoaminosilane ($H_3$—Si—R (R denotes an amino group))
Flow rate (sccm) of processing gas: 50 sccm
Processing time (s): 15 s <Process ST13a>
Internal pressure (mTorr) of processing vessel 12: 200 mTorr
Value (W) of high frequency power of first high frequency power supply 62: 300 W, 10 kHz, Duty 50
Value (W) of high frequency power of second high frequency power supply 64: 0 W
Value (V) of DC voltage of power supply 70: 0 V
Processing gas (second gas): $CO_2$ gas
Flow rate (sccm) of processing gas: 300 sccm
Processing time (s): 5 s <Sequence SQ1>
Repetition number: 5 times <Sequence SQ1a>
Repetition number 5 times In the above-described method MT, the process ST1 of conformally forming the protection film SX on the main surface SC of the wafer W (including the inner surface SF2 of the groove portion TR) and the process ST2 of etching the bottom portion BT of the groove portion TR provided on the main surface SC after the process ST1 may be alternately repeated (process ST3). Thus, by appropriately adjusting the film thickness TH of the protection film SX or the like for each of the multiple cycles of the process ST1 and by appropriately adjusting the etching amount or the like for each of the multiple cycles of the process ST2, the groove portion TR can be processed with relatively high accuracy according to the various required shapes of the groove portion TR.

Furthermore, in the process ST1a, since the protection film SX is conformally formed on the main surface SC of the wafer W (including the inner surface SF2 of the groove portion TR) by the same method as the ALD method, the strength of protection of the main surface SC of the wafer W can be improved, and the protection film SX for protecting the main surface SC of the wafer W can be formed in the uniform thickness.

Moreover, since the process ST1b only consists of the process ST11b of forming the reaction precursor (layer Ly1) on the main surface SC of the wafer W (including the inner surface SF2 of the groove portion TR) with the first gas and the process ST12b of purging the internal space of the processing vessel 12 after the completion of the process ST11b, the protection film SX formed through the process ST1b can be formed of the reaction precursor (layer Ly1) formed in the process ST11b, and, accordingly, can be a relatively thin film. In addition, since the plasma of the fourth gas containing oxygen is used in the process ST2 following the process ST1b, oxygen can be added to the reaction precursor (layer Ly1) formed in the process ST11b, and the protection film SX having the same composition as the protection film formed by the same method as the ALD method can be formed to have a relatively thin thickness. Furthermore, since the addition of the oxygen gas can be performed during the etching of the process ST2, high efficiency of the processing can be achieved.

Further, in the process ST1a, since the protection film SX is conformally formed on the main surface SC of the wafer W (including the inner surface SF2 of the groove portion TR) by the same method as the ALD method, the strength of the protection of the main surface SC of the wafer W can be improved, and the protection film SX for protecting the main surface SC of the wafer W can be formed in the uniform thickness. Since the process ST1b only consists of the process ST11b of forming the reaction precursor (layer Ly1) on the main surface SC of the wafer W (including the inner surface SF2 of the groove portion TR) with the first gas and the process ST12b of purging the internal space of the processing vessel 12 after the completion of the process ST11b, the protection film SX formed through the process ST1b can be formed of the reaction precursor (layer Ly1) formed in the process ST11b, and, accordingly, can become a relatively thin film. In addition, since the plasma of the third gas containing oxygen is used in the process ST2 following the process ST1b, oxygen can be added to the reaction precursor (layer Ly1) formed in the process ST11b, and the protection film SX having the same composition as the protection film formed by the same method as the ALD method can be formed to have a relatively thin thickness. Furthermore, since the addition of the oxygen gas can be performed during the etching of the process ST2, high efficiency of the processing can be achieved. Further, in performing the N cycles of the sequence SQ1, since the sequence SQ1 including the aforementioned process ST1a is performed M times and the sequence SQ1 including the aforementioned process ST1b is performed N–M times, it is possible to cope with the formation of various shapes of the groove portion TR sufficiently.

Further, since the second gas contains oxygen atoms, in the process ST13a, the reaction precursor (layer Ly1) of the silicon formed in the process ST11a is bond with the oxygen atoms, so that the protection film SX of the silicon oxide can be conformally formed. Moreover, in case that the second gas is a carbon dioxide gas, since the second gas contains the carbon atoms, damage caused by the oxygen atoms can be suppressed by the carbon atoms.

In addition, since the first gas contains the aminosilane-based gas, the reaction precursor (layer Ly1) of the silicon can be formed along an atomic layer of the main surface SC of the wafer W through the process ST11a and the process ST11b.

Further, by using the first gas containing the monoaminosilane, the reaction precursor (layer Ly1) of the silicon can be formed through the process ST11a and the process ST11b.

Furthermore, aminosilane having one to three silicon atoms may be used as the aminosilane-based gas contained in the first gas. Alternatively, aminosilane having one to three amino groups may be used as the aminosilane-based gas contained in the first gas.

Further, before the process ST2 is performed, if the film thickness TH of the protection film SX formed in the process ST1 is in the range from 2 nm to 8 nm, the etching effect upon the corner portion CP of the wafer W covered with the protection film SX can be reduced, as compared to the case where the film thickness TH of the protection film SX is below 2 nm, particularly. Thus, the degree of deformation of the wafer W caused by the etching of the process ST2 can be reduced.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A method of processing a target object, the method comprising:
    preparing the target object including a first protrusion portion, a second protrusion portion, an etching target layer and a groove portion, the etching target layer having a region belonging to the first protrusion portion and a region belonging to the second protrusion portion, the groove portion being provided on a main surface of the target object, being provided on the etching target layer and being defined by the first protrusion portion and the second protrusion portion, and an inner surface of the groove portion being included in the main surface of the target object, and
    performing a first sequence repeatedly N times (N is an integer equal to or larger than 2),
    wherein the first sequence comprises:
    forming a protection film conformally on the main surface of the target object in a processing vessel of a plasma processing apparatus in which the target object is accommodated; and
    etching a bottom portion of the groove portion of the target object with plasma of a gas generated within the processing vessel after the forming of the protection film conformally is performed,
    wherein a mask is formed on the region belonging to the first protrusion portion while the mask is not formed on the region belonging to the second protrusion portion, and
    a deposition film is formed on the mask.

2. The method of claim 1,
    wherein, in the forming of the protection film conformally, the protection film is conformally formed on the main surface of the target object by repeatedly performing a second sequence comprising:
    supplying a first gas into the processing vessel;
    purging a space within the processing vessel after the supplying of the first gas is performed;
    generating plasma of a second gas within the processing vessel after the purging of the space is performed; and
    purging the space within the processing vessel after the generating of the plasma of the second gas is performed,
    wherein, in the supplying of the first gas, plasma of the first gas is not generated.

3. The method of claim 1,
    wherein, in the forming of the protection film conformally, the protection film is conformally formed on the main surface of the target object by supplying a first gas into the processing vessel and purging a space within the processing vessel after the supplying of the first gas is performed,
    in the etching of the bottom portion of the groove portion, the bottom portion of the groove portion of the target object is etched with plasma of an oxygen-containing gas generated within the processing vessel, and
    in the supplying of the first gas, plasma of the first gas is not generated.

4. The method of claim 1,
    wherein, in the performing of the first sequence repeatedly N times, the first sequence including a first processing is performed M times (M is an integer equal to or lager than 1 and equal to or smaller than N−1), and the first sequence including a second processing is performed N−M times,
    wherein the first processing is included in the forming of the protection film conformally,
    in the first processing, the protection film is conformally formed on the main surface of the target object by repeatedly performing a second sequence comprising:
    supplying a first gas into the processing vessel;
    purging a space within the processing vessel after the supplying of the first gas is performed;
    generating plasma of a second gas within the processing vessel after the purging of the space is performed; and
    purging the space within the processing vessel after the generating of the plasma of the second gas is performed,
    wherein the second processing is included in the forming of the protection film conformally,
    in the second processing, the protection film is conformally formed on the main surface of the target object by supplying the first gas into the processing vessel and purging the space within the processing vessel after the supplying of the first gas is performed,
    in the etching of the bottom portion of the groove portion following the second processing, the bottom portion of the groove portion of the target object is etched by plasma of an oxygen-containing gas generated within the processing vessel, and
    plasma of the first gas is not generated in the supplying of the first gas performed in the first processing and the supplying of the first gas performed in the second processing.

5. The method of claim 2,
    wherein the second gas contains oxygen atoms.

6. The method of claim 5,
    wherein the second gas contains a carbon dioxide gas or an oxygen gas.

7. The method of claim 2,
    wherein the first gas contains an aminosilane-based gas.

8. The method of claim 7,
    wherein the first gas contains monoaminosilane.

9. The method of claim 7,
wherein the aminosilane-based gas contained in the first gas includes aminosilane having one to three silicon atoms.

10. The method of claim 7,
wherein the aminosilane-based gas contained in the first gas includes aminosilane having one to three amino groups.

11. The method of claim 1,
wherein a film thickness of the protection film formed in the forming of the protection film conformally is equal to or larger than 2 nm and equal to or smaller than 8 nm before the etching of the bottom portion of the groove portion is performed.

12. The method of claim 1,
wherein the protection film is not formed on the deposition film.

13. The method of claim 1,
wherein a height of the region belonging to the first protrusion portion is greater than a height of the region belonging to the second protrusion portion.

14. The method of claim 1,
wherein the main surface includes an upper surface of the region belonging to the second protrusion portion and a side surface of the groove portion,
after the etching of the bottom portion of the groove portion, a protection film formed on the upper surface of the region belonging to the second protrusion portion is removed while a protection film formed on the side surface of the groove portion remains.

15. A method of processing a target object, the method comprising:
preparing the target object including a protrusion portion, an etching target layer and a groove portion, the etching target layer having a region belonging to the protrusion portion, the groove portion being provided on a main surface of the target object, being provided on the etching target layer and being defined by the protrusion portion, and an inner surface of the groove portion being included in the main surface of the target object; and
performing a first sequence repeatedly N times (N is an integer equal to or larger than 2),
wherein the first sequence comprises:
forming a protection film conformally on the main surface of the target object in a processing vessel of a plasma processing apparatus in which the target object is accommodated; and
etching a bottom portion of the groove portion of the target object with plasma of a gas generated within the processing vessel after the forming of the protection film conformally is performed,
wherein a mask is not formed on the region belonging to the protrusion portion.

16. The method of claim 15,
wherein the main surface includes an upper surface of the region belonging to the protrusion portion and a side surface of the groove portion,
after the etching of the bottom portion of the groove portion, a protection film formed on the upper surface of the region belonging to the protrusion portion is removed while a protection film formed on the side surface of the groove portion remains.

* * * * *

UNITED STATES PATENT AND TRADEMARK OFFICE
CERTIFICATE OF CORRECTION

| | | |
|---|---|---|
| PATENT NO. | : 10,217,643 B2 | Page 1 of 1 |
| APPLICATION NO. | : 15/686285 | |
| DATED | : February 26, 2019 | |
| INVENTOR(S) | : Masahiro Tabata et al. | |

It is certified that error appears in the above-identified patent and that said Letters Patent is hereby corrected as shown below:

In the Specification

Column 15, Line 25, "SQL" should be -- SQ1 --.

Column 15, Line 42, "SQL" should be -- SQ1 --.

Column 15, Line 65, "SQL" should be -- SQ1. --.

Column 16, Line 37, "thy" should be -- thv --.

Column 16, Line 42, "thy" should be -- thv --.

Signed and Sealed this
Twenty-first Day of May, 2019

Andrei Iancu
*Director of the United States Patent and Trademark Office*